United States Patent
Karda et al.

(10) Patent No.: US 11,658,242 B2
(45) Date of Patent: May 23, 2023

(54) INTEGRATED ASSEMBLIES CONTAINING DIFFUSION ALLEVIATING TWO-DIMENSIONAL MATERIALS

(71) Applicant: Micron Technology, Inc., Boise, ID (US)

(72) Inventors: Kamal M. Karda, Boise, ID (US); Chandra Mouli, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/524,653

(22) Filed: Nov. 11, 2021

(65) Prior Publication Data
US 2022/0069124 A1    Mar. 3, 2022

Related U.S. Application Data

(62) Division of application No. 16/542,078, filed on Aug. 15, 2019, now Pat. No. 11,211,487.

(51) Int. Cl.
*H01L 29/78* (2006.01)
*H01L 29/06* (2006.01)
(Continued)

(52) U.S. Cl.
CPC .... *H01L 29/7827* (2013.01); *H01L 27/10808* (2013.01); *H01L 29/04* (2013.01);
(Continued)

(58) Field of Classification Search
CPC ........... H01L 29/7827; H01L 27/10808; H01L 29/04; H01L 29/0684; H01L 29/0847;
(Continued)

(56) References Cited

U.S. PATENT DOCUMENTS 9,608,094 B2   3/2017   Verhulst et al.
10,374,009 B1  8/2019   Cheng et al.
(Continued)

FOREIGN PATENT DOCUMENTS

| EP | 2993696 | 3/2016 |
|---|---|---|
| WO | WO PCT/US2020/043222 | 11/2020 |
| WO | WO PCT/US2020/043222 | 2/2022 |

OTHER PUBLICATIONS

W. C. -Y. Ma and Y. -H. Chen, "Performance Improvement of Poly-Si Tunnel FETs by Trap Density Reduction," in IEEE Transactions on Electron Devices, vol. 63, No. 2, pp. 864-868, Feb. 2016, doi: 10.1109/TED.2015.2505734. (Year: 2016).*

(Continued)

*Primary Examiner* — John P. Dulka
(74) *Attorney, Agent, or Firm* — Wells St. John P.S.

(57) ABSTRACT

Some embodiments include an integrated assembly having a semiconductor material with a more-doped region adjacent to a less-doped region. A two-dimensional material is between the more-doped region and a portion of the less-doped region. Some embodiments include an integrated assembly which contains a semiconductor material, a metal-containing material over the semiconductor material, and a two-dimensional material between a portion of the semiconductor material and the metal-containing material. Some embodiments include a transistor having a first source/drain region, a second source/drain region, a channel region between the first and second source/drain regions, and a two-dimensional material between the channel region and the first source/drain region.

15 Claims, 9 Drawing Sheets

(51) Int. Cl.
*H01L 29/04* (2006.01)
*H01L 27/108* (2006.01)
*H01L 29/45* (2006.01)
*H01L 29/08* (2006.01)
*H01L 29/10* (2006.01)
*H01L 29/267* (2006.01)

(52) U.S. Cl.
CPC ...... *H01L 29/0684* (2013.01); *H01L 29/0847* (2013.01); *H01L 29/1037* (2013.01); *H01L 29/267* (2013.01); *H01L 29/456* (2013.01)

(58) Field of Classification Search
CPC . H01L 29/1037; H01L 29/267; H01L 29/456; H01L 29/78618; H01L 29/78642; H01L 27/10873; H01L 29/785
See application file for complete search history.

(56) References Cited

U.S. PATENT DOCUMENTS

| | | |
|---|---|---|
| 2005/0026334 A1 | 2/2005 | Knall |
| 2008/0067495 A1 | 3/2008 | Verhulst |
| 2010/0327319 A1* | 12/2010 | Iacopi et al. ........ H01L 29/7391 257/E21.403 |
| 2016/0064535 A1* | 3/2016 | Verhulst ............. H01L 29/1033 257/12 |
| 2017/0033003 A1* | 2/2017 | Song ...................... H01L 29/45 |
| 2018/0268890 A1 | 9/2018 | Gupta et al. |
| 2019/0131410 A1 | 5/2019 | Li et al. |

OTHER PUBLICATIONS

Hu et al., "Proton Transport through One Atom Thick Crystals", Nature, 2014, United Kingdom, 19 pages.

* cited by examiner

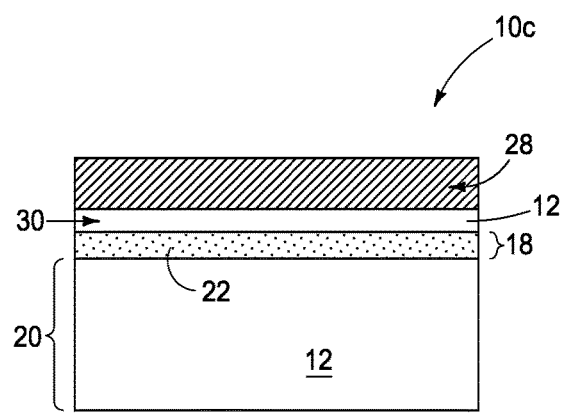
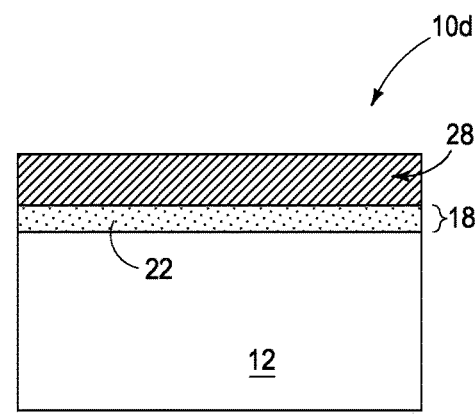
FIG. 4  FIG. 5

INTEGRATED ASSEMBLIES CONTAINING DIFFUSION ALLEVIATING TWO-DIMENSIONAL MATERIALS

RELATED PATENT DATA

This application resulted from a divisional of U.S. patent application Ser. No. 16/542,078 filed Aug. 15, 2019 which is hereby incorporated by reference herein.

TECHNICAL FIELD

Integrated assemblies containing two-dimensional materials.

BACKGROUND

Integrated assemblies may include dopants or other materials that may problematically diffuse or otherwise problematically migrate. For instance, polycrystalline silicon may have varying grain sizes, and such may enable dopant to diffuse to varying depths within the polycrystalline silicon. The performance of highly integrated devices (e.g., transistors) may be impacted by the diffusion depth of the dopant. The varying depths of diffusion across an arrangement of integrated devices may problematically lead to non-uniformity of performance of the integrated devices; which can lead to operational difficulties, and even to device failure. As another example, metal may migrate from metal silicide (or another source of metal) and problematically alter electrical properties of nearby regions.

It would be desirable to develop structures which can be readily incorporated into integrated assemblies to alleviate, or even prevent, the problematic migration of dopants and other materials.

BRIEF DESCRIPTION OF THE DRAWINGS

FIGS. 1-11 are diagrammatic cross-sectional side views of regions of example integrated assemblies.

DETAILED DESCRIPTION OF THE ILLUSTRATED EMBODIMENTS

Some embodiments include integrated assemblies having two-dimensional materials utilized in barrier regions to preclude undesired migration of dopants and other materials. Example embodiments are described with reference to FIGS. 1-12.

Figure 1:
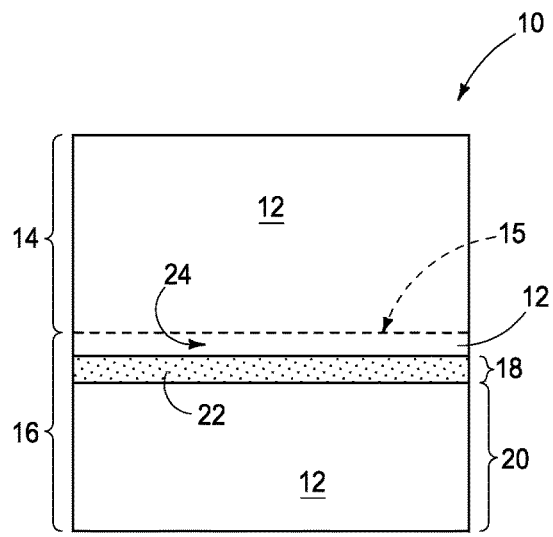

Referring to FIG. 1, an integrated assembly 10 includes a semiconductor material 12 having a first region 14 over a second region 16. The first region is more doped than the second region. A dashed line 15 is provided to diagrammatically illustrate an approximate barrier between the first and second regions 14 and 16.

The semiconductor material 12 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some applications, the semiconductor material 12 may comprise, consist essentially of, or consist of polycrystalline silicon.

The doped region 14 of the semiconductor material 12 may comprise any suitable dopant concentration; and in some embodiments may be heavily-doped (i.e., doped to a concentration of at least about $10^{20}$ atoms/cm$^3$). The dopant within the region 14 may be p-type or n-type; and in some embodiments may include one or more of boron, phosphorus, arsenic, etc. The region 16 of the semiconductor material 12 may be doped to a concentration of less than or equal to about $10^{18}$ atoms/cm$^3$, or even less than or equal to about $10^{16}$ atoms/cm$^3$; and in some embodiments may be intrinsically doped (or in other words may be effectively undoped).

A problem that may occur in conventional assemblies is that dopant may migrate from the region 14 into the region 16. If the semiconductor material 12 comprises polycrystalline material (e.g., polycrystalline silicon), the dopant may migrate along grain boundaries. In the illustrated embodiment of FIG. 1, a barrier region 18 is provided to alleviate, or even prevent, undesired dopant migration. Specifically, the barrier region is provided between the more-doped region 14 of the semiconductor material 12 and a portion 20 of the less-doped region 16.

The barrier region 18 comprises a two-dimensional material 22. The term "two-dimensional material" refers to a material having one or more layers with stronger forces within each layer (ionic, covalent, etc.) than along edges of the layers (e.g., between adjacent layers). The forces along edges of the layers (e.g., between adjacent layers) will generally be predominantly van der Waals forces. The two-dimensional material 22 may comprise any suitable number of layers; and in some embodiments may comprise a stack having 1 to 10 separate layers.

The two-dimensional material 22 may comprise any suitable composition(s); and in some embodiments may comprise one or more of carbon, boron, germanium, silicon, tin, phosphorus, bismuth, molybdenum, platinum, tungsten and hafnium. In specific applications, the two-dimensional material 22 may comprise one or more of graphene, graphyne, borophene, germanene, silicene, Si$_2$BN, stanine, phosphorene, bismuthene, molybdenum disulfide, molybdenum diselenide, tungsten diselenide, and hafnium disulfide. In some embodiments, molybdenum sulfide may be advantageous in that it can be very thin (less than 5 Å) to enable electrons to tunnel through the molybdenum sulfide. Also, the band offset relative to polysilicon is small, so the tunneling barrier may be small in configurations in which the molybdenum sulfide is directly adjacent to polysilicon. In some embodiments, it may be advantageous to utilize molybdenum disulfide and/or molybdenum diselenide within the two-dimensional material 22 as such may be readily fabricated as part of an integrated assembly.

An advantage of the two-dimensional material 22 is that such may preclude dopant migration, while still enabling electrons to pass therethrough. Accordingly, the portion 20 of the less-doped region 16 remains electrically coupled with the more-doped region 14 even though the barrier region 18 is in place to preclude dopant migration from the more-doped region 14 to the less-doped portion 20.

The barrier region 18 may comprise a single two-dimensional material 22 (as shown) or may comprise a laminate of two or more different two-dimensional materials.

Figure 2:
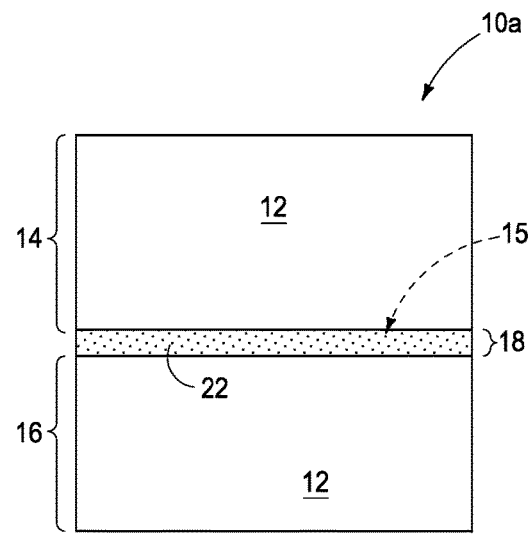

The barrier region 18 may be provided in any suitable location within the semiconductor material 12. In the embodiment of FIG. 1, the barrier region 18 is offset from the boundary 15 of the more-doped region 14 by an intervening region 24 of the semiconductor material 12. In other embodiments, the barrier region 18 may be directly against the more-doped region 14 of the semiconductor material 12, as shown in FIG. 2. Specifically, FIG. 2 shows an integrated assembly 10a in which the barrier region 18 is directly against the interface 15 along the bottom of the more-doped region 14. The barrier region 18 may act as a barrier during dopant activation (rapid thermal processing, laser annealing, etc.) to constrain a desired junction depth.

Figure 3:
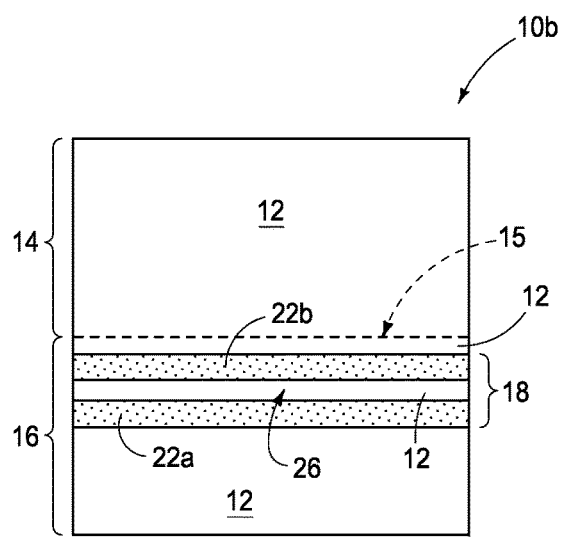

In some embodiments, the barrier region 18 may comprise two or more two-dimensional materials 22 which may be directly against one another, or which may be spaced from one another by an intervening region of the semiconductor material 12. For instance, FIG. 3 shows an assembly 10b in which the barrier region 18 comprises a pair of two-dimensional materials 22a and 22b which are spaced from one another by an intervening region 26 of the semiconductor material 12. The two-dimensional materials 22a and 22b may be the same composition as one another, or may be different compositions relative to one another. The two-dimensional materials 22a and 22b may be the same thickness as one another, or may be different thicknesses relative to one another. An advantage of utilizing two two-dimensional materials in the barrier region 18 may be that the second material may assist in precluding migration through the barrier region 18 if the first material is somewhat leaky to the dopant entering the barrier region 18.

In some embodiments, the barrier region 18 of FIG. 3 may be considered to comprise a first part comprising the first two-dimensional material 22a, and to comprise a second part comprising the additional two-dimensional material 22b. The first part may be considered to be spaced from the second part by the intervening region 26 of the semiconductor material 12.

In some embodiments, the barrier region 18 may alleviate or preclude migration of metal-containing materials in addition to, or alternatively to, precluding migration of dopant. For instance, FIG. 4 shows an assembly 10c having a metal silicide 28 (or another metal-containing material) over a semiconductor material 12. In conventional configurations, metal may problematically migrate from the metal silicide (and/or from another metal-containing material) into the semiconductor material 12 to alter electrical properties of the semiconductor material and/or to alter electrical properties of other materials (not shown) proximate the semiconductor material. In the shown embodiment, a barrier region 18 is provided proximate the metal-containing material 28. The barrier region 18 comprises the two-dimensional material 22, and may alleviate or preclude migration of metal therethrough while enabling electrical coupling to be retained across the two-dimensional material (i.e., barrier material). For instance, in the shown embodiment the barrier region 18 is between the portion 20 of the semiconductor material 12 and the metal-containing material 28, and may preclude migration of metal into the portion 20 while enabling electrical coupling between the portion 20 and the metal-containing material 28.

In some example embodiments, the metal-containing material 28 may comprise, consist essentially of, or consist of metal silicide. For instance, the metal-containing material 28 may comprise, consist essentially of, or consist of cobalt silicide. The cobalt may be the metal which problematically migrates, and the two-dimensional material 22 within the barrier region 18 may advantageously preclude the undesired migration of the cobalt.

The configuration of FIG. 4 shows the barrier region 18 spaced from the metal-containing material 28 by an intervening region 30 of the semiconductor material 12. In other embodiments the barrier region may be directly against the metal-containing material 28, as shown in FIG. 5 relative to an example integrated assembly 10d.

The barrier regions 18 of FIGS. 1-5 may be utilized in any suitable integrated assemblies. In some embodiments, the barrier regions may be incorporated into integrated transistors as described with reference to FIGS. 6-11.

Figure 6:
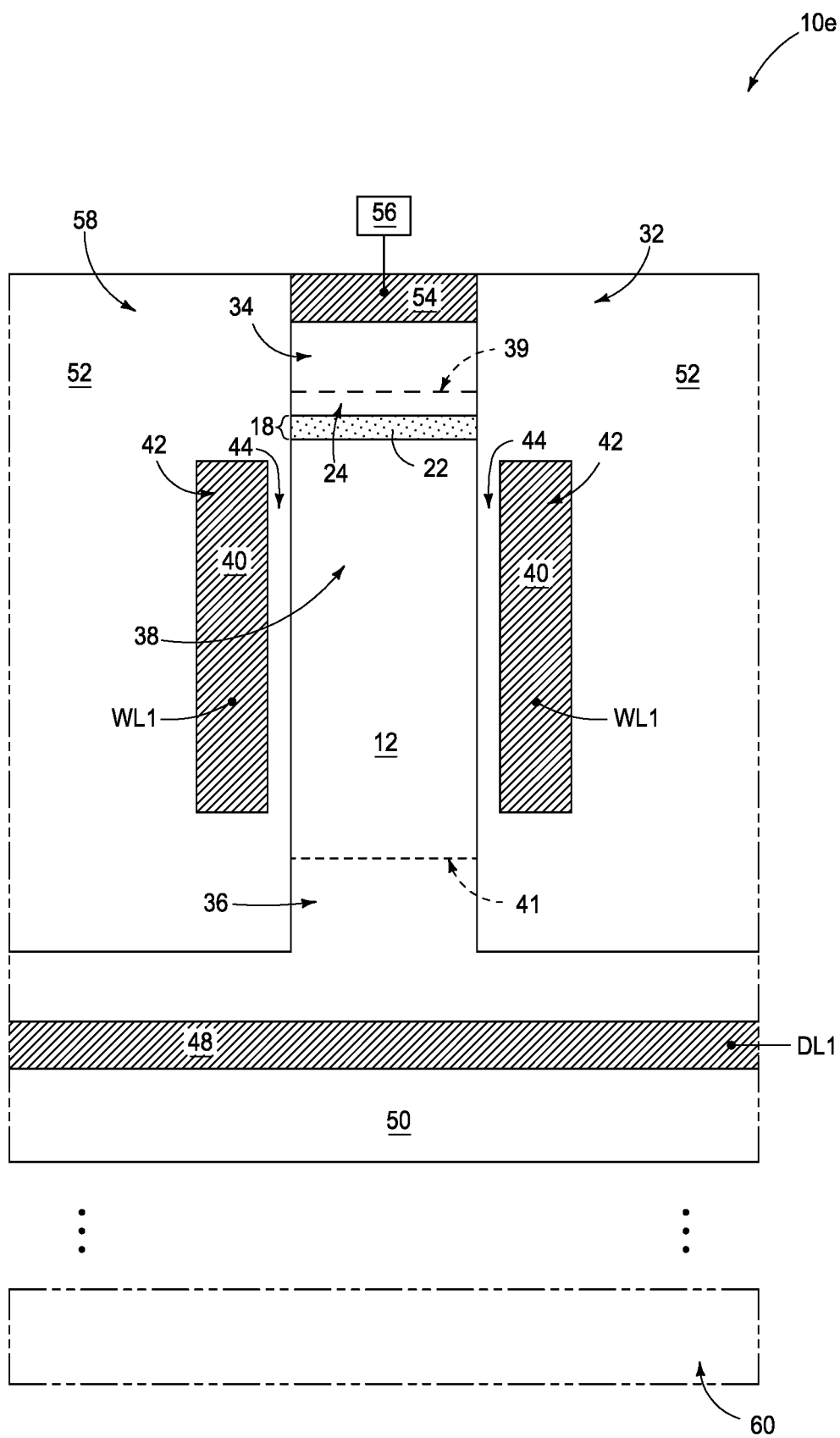
Figure 7:
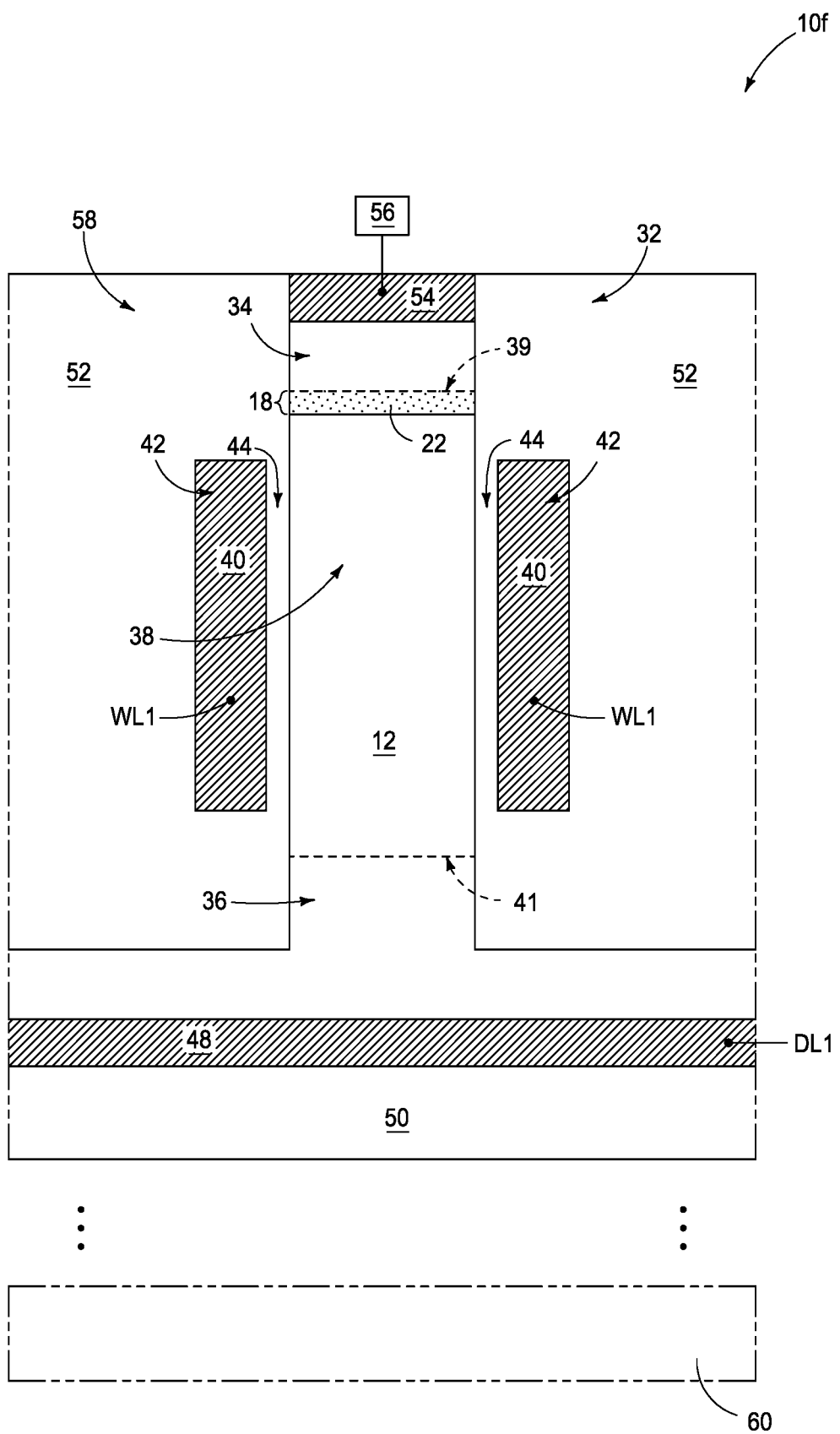

Referring to FIG. 6, an assembly 10e includes a transistor 32. The transistor 32 includes a first source/drain region 34, a second source/drain region 36, and a channel region 38 between the first and second source/drain regions. Dashed lines 39 and 41 are provided to show approximate boundaries of the source/drain regions 34 and 36.

The source/drain regions 34 and 36 may be heavily doped with n-type dopant or p-type dopant (e.g., one or more of phosphorus, boron and arsenic); and the channel region 38 may be less heavily doped, or may even be intrinsically doped. It is desired to preclude dopant migration from the heavily-doped source/drain regions into the channel region.

The regions 34, 36 and 38 are within a semiconductor material 12. The semiconductor material 12 may comprise any of the compositions described above with reference to FIG. 1; and in some embodiments may comprise, consist essentially of, or consist of polycrystalline silicon.

The transistor 32 includes electrically conductive gate material 40 which forms a conductive gate 42 adjacent the channel region 38. The gate material 40 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The conductive gate 42 is spaced from the channel region 38 by gate dielectric material 44. The gate dielectric material may comprise any suitable composition(s); and in some embodiments may comprise, consist essentially of, or consist of silicon dioxide.

The transistor 32 includes a barrier region 18 between the channel region 38 and the first source/drain region 34. The barrier region 18 comprises the two-dimensional material 22 described above with reference to FIG. 1.

The illustrated transistor may be representative of a multitude of transistors extending across an integrated assembly. In some embodiments, the semiconductor material 12 comprises polycrystalline silicon. Grain sizes may vary throughout the polycrystalline silicon, which may lead to dopant diffusing (or otherwise migrating) along grain boundaries. The dopant may migrate from the source/drain region 34 toward the channel region 38, and the amount of migration may vary depending on grain sizes within various regions of the polycrystalline semiconductor material 12. Accordingly, the amount of migration may be difficult to control across the transistors of an integrated assembly. The barrier region 18 may stop the migration of the dopant at the predetermined level corresponding to the level of the barrier region, which can enable better control of the dopant profile as compared to conventional configurations.

The illustrated transistor 32 is within an integrated assembly which includes a digit line DL1 under the source/drain region 36 and electrically coupled with such source/drain region. The digit line comprises a conductive material 48. The material 48 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The digit line DL1 is supported by an insulative material 50. The material 50 may comprise any suitable composition(s); and in some embodiments may comprise, consist essentially of, or consist of silicon dioxide.

The transistor gates 42 are part of a wordline WL1.

The wordline WL1 extends in and out of the page relative to the cross-section of FIG. 6, while the digit line DL1 extends along the cross-section of FIG. 6. Accordingly, the wordline extends substantially orthogonally relative to the digit line (with the term "substantially orthogonal" meaning orthogonal to within reasonable tolerances of fabrication and management).

The gate 42 may have any suitable configuration. In the illustrated embodiment of FIG. 6, the gate is along two sides of the channel region 38. In other embodiments the gate may be along only a single side of the channel region, along three sides of the channel region, or may extend entirely around the channel region (i.e., may be part of a gate-all-around configuration). Also, it is to be understood that embodiments may be extended to any device geometries which may benefit from the barrier regions described herein, include finFET configurations, etc.

An insulative material 52 extends around the gate 42. The insulative material 52 may comprise any suitable composition(s); and in some embodiments may comprise, consist essentially of, or consist of silicon dioxide. In the illustrated embodiment, the gate dielectric material 44 merges with the insulative material 52 to indicate that the gate dielectric material 44 and the insulative material 52 may comprise a same composition as one another. In other embodiments the gate dielectric material 44 may comprise a different composition than the insulative material 52.

A conductive material 54 is over the source/drain region 34. The conductive material 54 may comprise any suitable composition(s); and in some embodiments may comprise a metal-containing material (e.g., at least a portion of the material 54 may comprise, consist essentially of, or consist of copper, platinum, titanium, tantalum, etc.) and/or a metal silicide (e.g., tantalum silicide, titanium silicide, cobalt silicide, etc.).

A storage element 56 is electrically coupled with the source/drain region 34 through the conductive material 54. The storage element 56 may be any suitable device having at least two detectable states; and in some embodiments may be, for example, a capacitor, a resistive-memory device, a conductive-bridging device, a phase-change-memory (PCM) device, a programmable metallization cell (PMC), etc.

The storage element 56 and transistor 32 may be together comprised by a memory structure 58. In some embodiments, the memory structure 58 may be a dynamic random-access memory (DRAM) cell, and the storage element 56 may be a capacitor. The illustrated memory structure 58 may be representative of a large plurality of memory structures of a memory array.

In the illustrated embodiment, the memory structure 58 is supported by a base 60. The base 60 may comprise semiconductor material; and may, for example, comprise, consist essentially of, or consist of monocrystalline silicon. The base 60 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 60 may correspond to a semiconductor substrate containing one or more materials associated with integrated circuit fabrication. Such materials may include, for example, one or more of refractory metal materials, diffusion materials, insulator materials, etc.

A gap is provided between the base 60 and the insulative material 50 to indicate that there may be other materials, structures, etc., provided between the base 60 and the insulative material 50. Alternatively, the insulative material 50 may be directly against an upper surface of the base 60.

The embodiment of FIG. 6 has the intervening region 24 between the first source/drain region 34 and the two-dimensional material 22 analogous to the configuration of FIG. 1 (i.e., the first source/drain region 34 is spaced from the two-dimensional material 22 by an intervening region of the semiconductor material 12). In other embodiments, the bottom of the source/drain region 34 may be directly against the two-dimensional material 22, as shown in an assembly 10f of FIG. 7.

Figure 8:
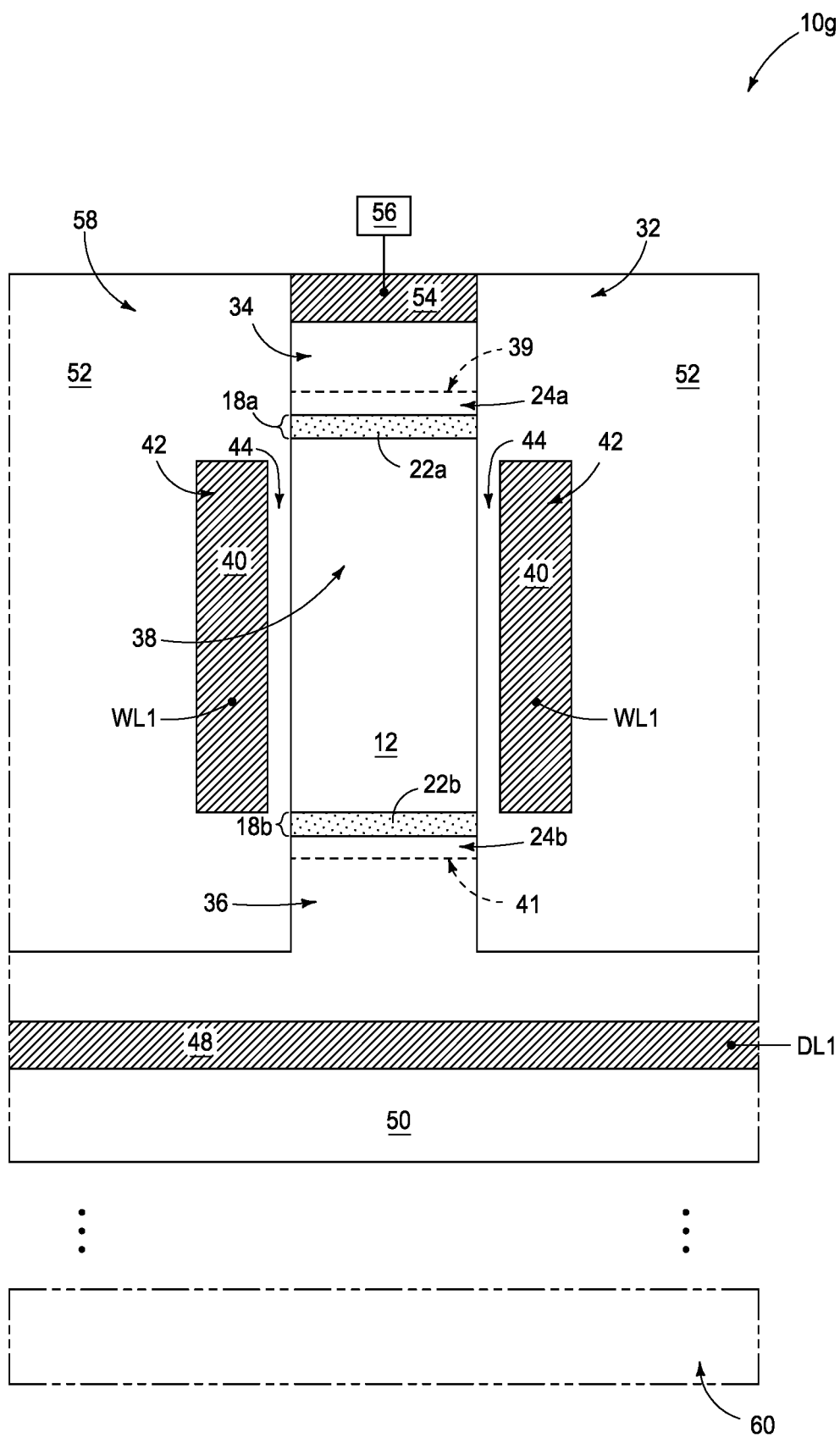

In some embodiments, a barrier region 18 may be provided between the second source/drain region 36 and the channel region 38, either in addition to the barrier region provided between the first source/drain region and the channel region, or alternatively to the barrier region provided between the first source/drain region and the channel region. For instance, FIG. 8 shows an assembly 10g in which a first barrier region 18a is provided between the source/drain region 34 and the channel region 12, and a second barrier region 18b is provided between the source/drain region 36 and the channel region 12.

The first barrier region 18a comprises a first two-dimensional material 22a, and the second barrier region 18b comprises a second two-dimensional material 22b. The materials 22a and 22b may be compositionally the same as one another, or may be compositionally different relative to one another.

In the illustrated embodiment, the barrier regions 18a and 18b are spaced from the source/drain regions 34 and 36 by intervening regions 24a and 24b. In other embodiments, one or both of the intervening regions 24a and 24b may be omitted so that one or both of the barrier regions 18a and 18b is directly against the adjacent source/drain region.

Figure 9:
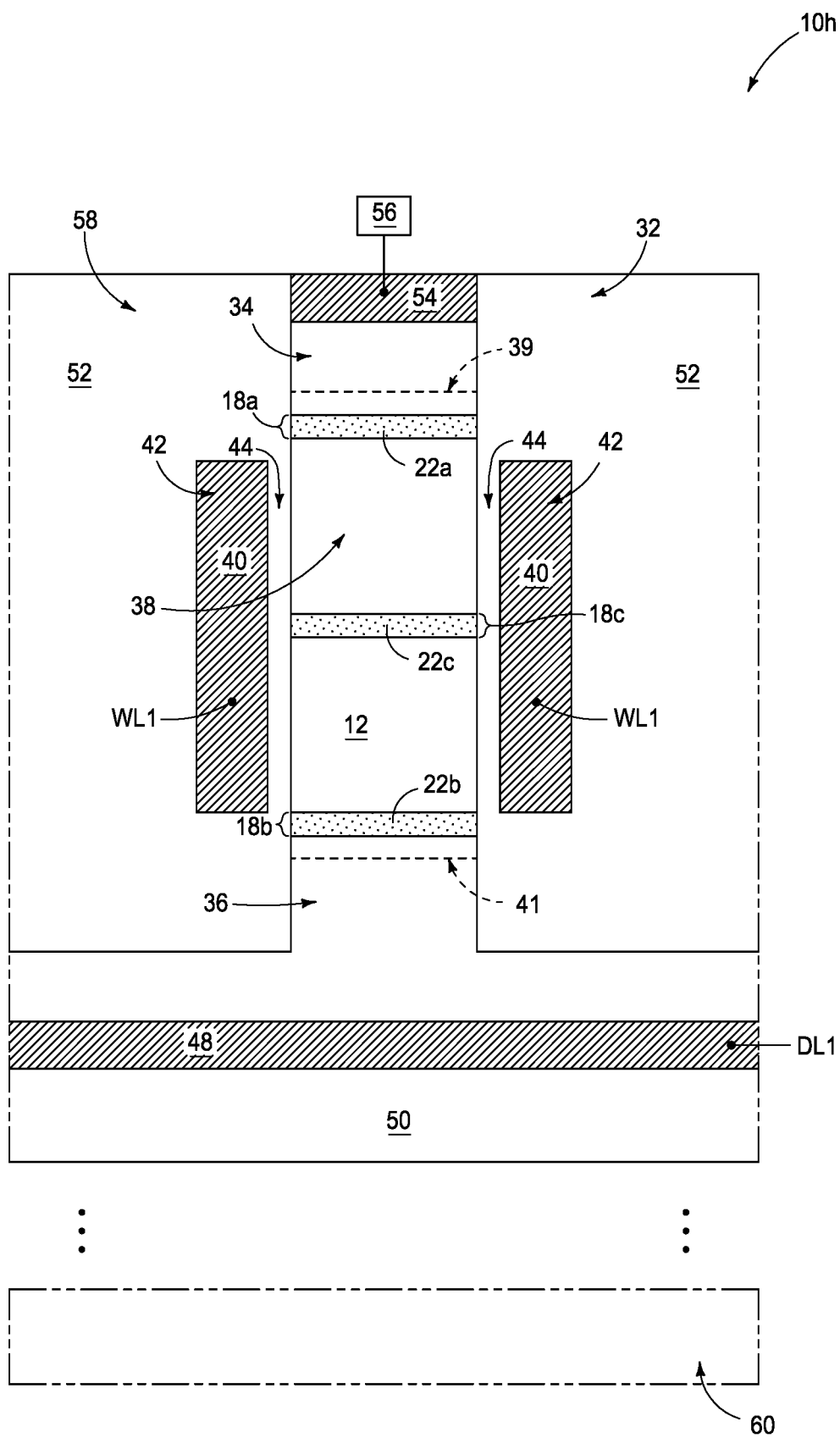

In some embodiments, an additional barrier region may be provided within the channel region 38, as shown in an assembly 10h of FIG. 9. Specifically, the assembly 10h of FIG. 9 is identical to the assembly 10g of FIG. 8, except that the assembly 10h includes a third barrier region 18c in the channel region 38. The barrier region 18c includes a two-dimensional material 22c. The two-dimensional material 22c may be identical to one or both of the two-dimensional materials 22a and 22b, or may be different from both of the two-dimensional materials 22a and 22b. The two-dimensional material 22c within the channel region 38 may be utilized to preclude migration of dopant or other materials across the channel region in the event that such may enter into the channel region.

Figure 10:
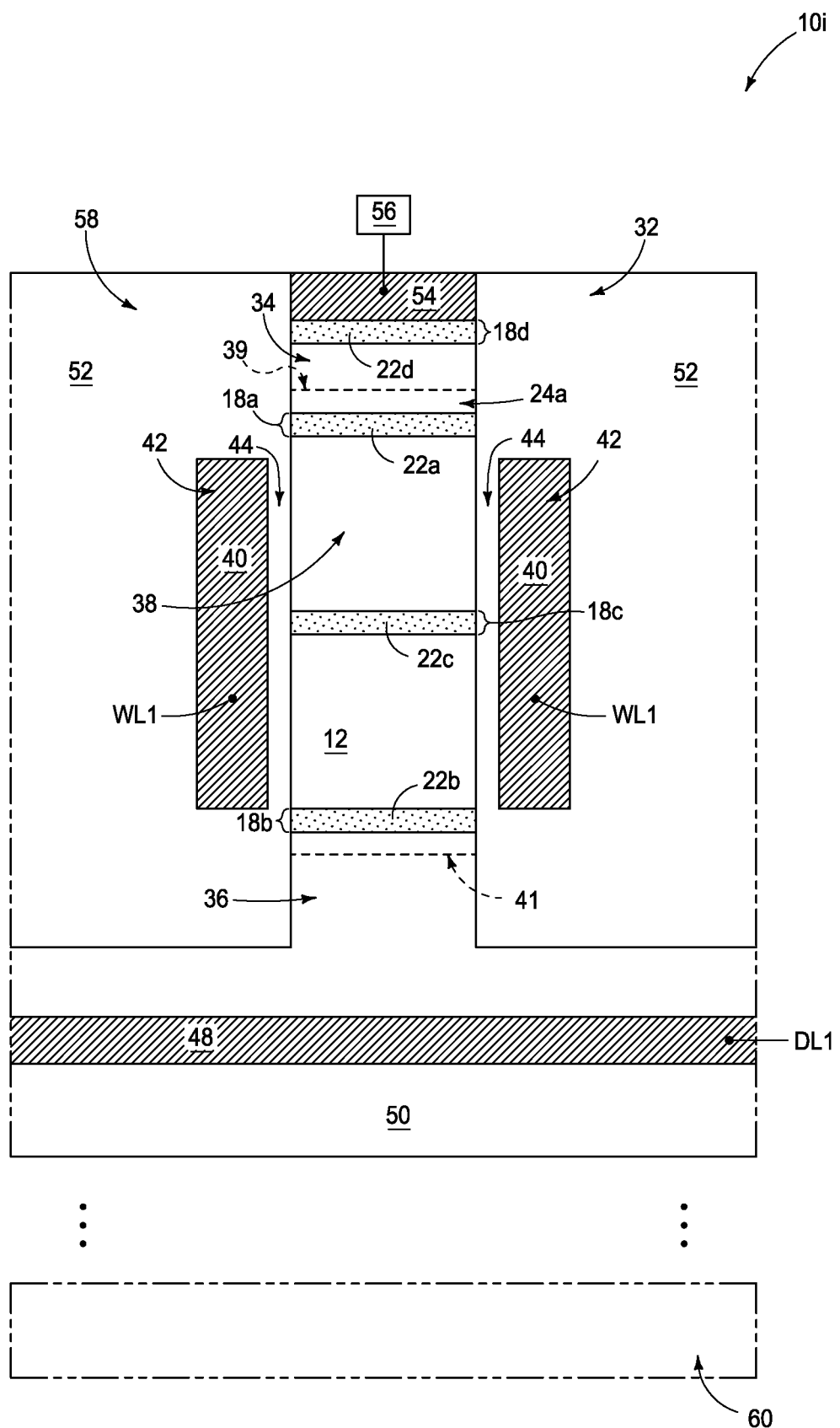

In some embodiments, an additional barrier region may be provided adjacent the metal-containing material 54, as shown in an assembly 10i of FIG. 10. Specifically, the assembly 10*i* of FIG. 10 is identical to the assembly 10*h* of FIG. 9, except that the assembly 10*i* includes a fourth barrier region 18*d* directly adjacent the metal-containing material 54. The barrier region 18*d* includes a two-dimensional material 22*d*. The two-dimensional material 22*d* may be identical to one or more of the two-dimensional materials 22*a*, 22*b* and 22*c*; or may be different from all of the two-dimensional materials 22*a*, 22*b* and 22*c*. The two-dimensional material 22*d* may be utilized to preclude migration of metal (e.g., cobalt) from the metal-containing material 54 into the semiconductor material 12 (and in the shown embodiment, may be used to preclude migration of the metal into the source/drain region 34).

Various embodiments may include any of the barrier regions 18*a*-18*d*, either alone or in combination with any other of the barrier regions 18*a*-18*d*.

Figure 11:
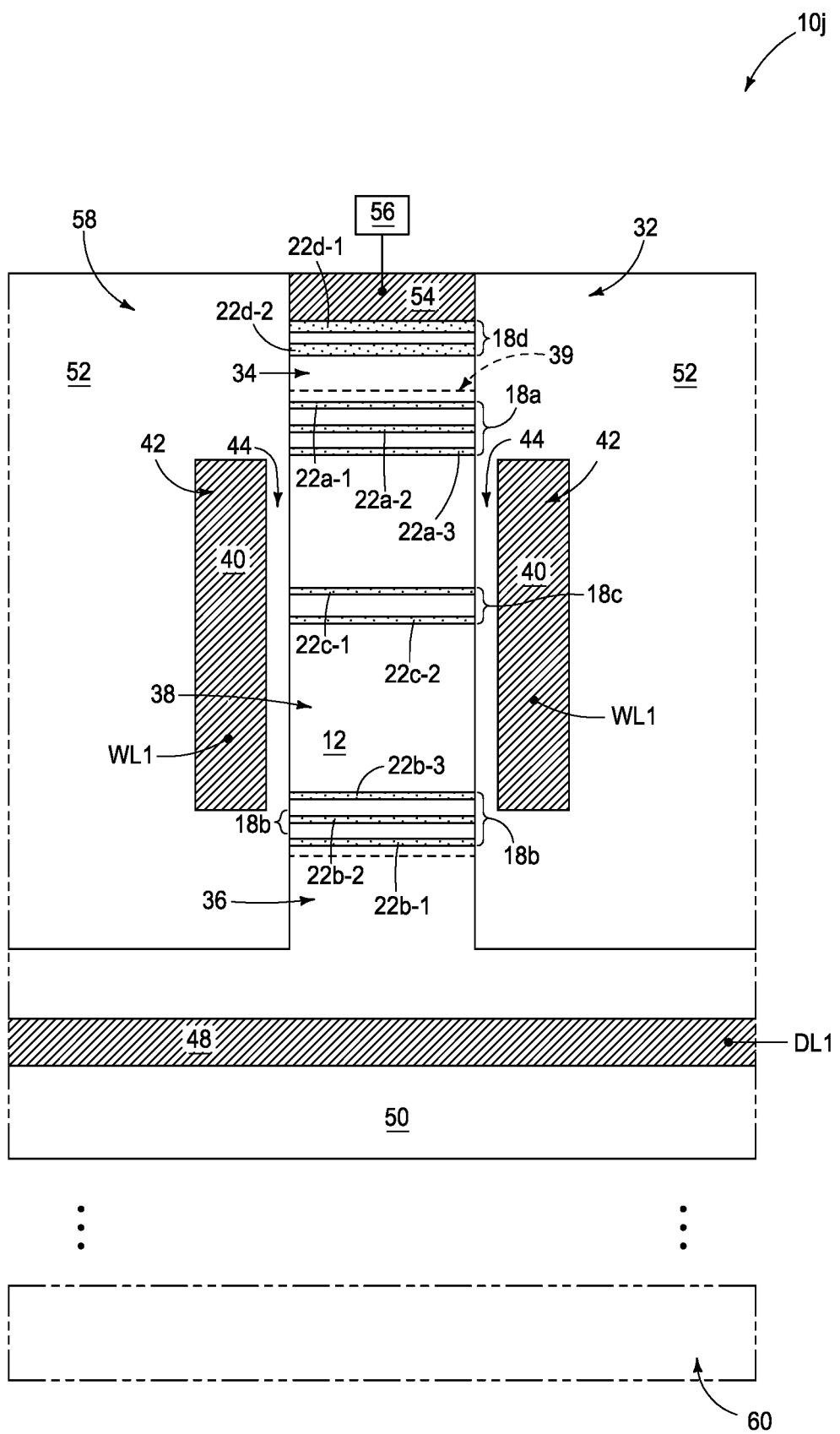

In some embodiments, one or more of the barrier regions 18*a*-18*d* may include two or more two-dimensional materials. The two-dimensional materials within an individual barrier region may be directly against one another, or may be spaced from one another by an intervening region of the semiconductor material 12. FIG. 11 shows an integrated assembly 10*j* having barrier regions 18*a*-18*d* which each comprise two or more two-dimensional materials. Specifically, the barrier region 18*a* comprises three two-dimensional materials 22*a*-1, 22*a*-2 and 22*a*-3; the barrier region 18*b* comprises three two-dimensional materials 22*b*-1, 22*b*-2 and 22*b*-3; the barrier region 18*c* comprises a pair of two-dimensional materials 22*c*-1 and 22*c*-2; and the barrier region 18*d* comprises a pair of two-dimensional materials 22*d*-1 and 22*d*-2. The various two-dimensional materials may comprise any suitable compositions; and may, for example, comprise any of the compositions described relative to the barrier material 22 of FIG. 1. Two or more of the two-dimensional materials of FIG. 11 may be a same composition as one another, and/or one or more of the two-dimensional materials may be a different composition than one or more others of the two-dimensional materials.

Figure 12:
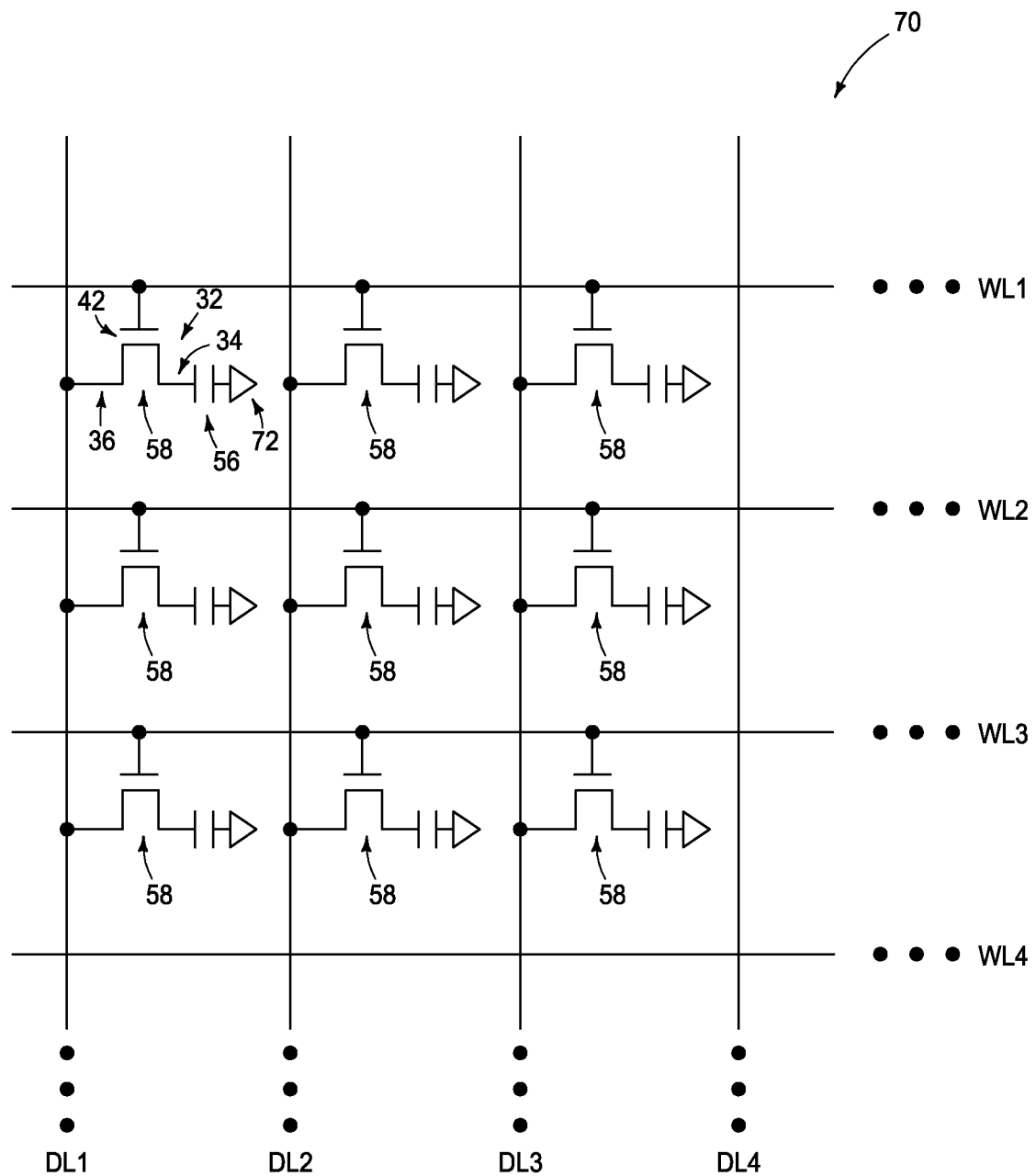
FIG. 12 is a diagrammatic schematic view of a region of an example memory array.

The memory structures 58 may be incorporated into memory arrays, such as, for example, DRAM arrays. FIG. 12 schematically illustrates a region of an example DRAM array 70. The DRAM array 70 comprises a plurality of wordlines (WL1-WL4) and a plurality of digit lines (DL1-DL4). The wordlines may be considered to extend along rows of the memory array, and the digit lines may be considered to extend along columns of the memory array.

The memory structures 58 have the transistors 32. The gates 42 of the transistors are coupled with the wordlines. The source/drain regions 36 of the transistors are coupled with the digit lines, and the source/drain regions 34 of the transistors are coupled with storage elements 56 corresponding to capacitors. Each of the capacitors is coupled with a reference voltage 72. The reference voltage may be any suitable reference voltage including, for example, ground, VCC/2, etc.

Each of the memory structures 58 is uniquely addressed by a combination of one of the wordlines and one of the digit lines.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a semiconductor material with a more-doped region adjacent a less-doped region. A two-dimensional material is between the more-doped region and a portion of the less-doped region.

Some embodiments include an integrated assembly which contains a semiconductor material, a metal-containing material over the semiconductor material, and a two-dimensional material between a portion of the semiconductor material and the metal-containing material.

Some embodiments include a transistor having a first source/drain region, a second source/drain region, a channel region between the first and second source/drain regions, and a two-dimensional material between the channel region and the first source/drain region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
a semiconductor material having a more-doped region adjacent a less-doped region; and
a diffusion barrier region between the more-doped region and a portion of the less-doped region, the diffusion barrier region comprising multiple layers and having at least two distinct layers of two-dimensional material spaced from one another by an intervening region.

2. The integrated assembly of claim 1 wherein the semiconductor material is a polycrystalline material.

3. The integrated assembly of claim 1 wherein the semiconductor material comprises polycrystalline silicon.

4. The integrated assembly of claim 3 wherein the more-doped region comprises one or more of boron, phosphorus and arsenic.

5. The integrated assembly of claim 1 wherein the two-dimensional material comprises one or more of carbon, boron, germanium, silicon, tin, phosphorus, bismuth, molybdenum, platinum, tungsten and hafnium.

6. The integrated assembly of claim 1 wherein the two-dimensional material comprises one or more of graphene, graphyne, borophene, germanene, silicene, $Si_2BN$, stanine, phosphorene, bismuthene, molybdenum disulfide, molybdenum diselenide, tungsten diselenide, and hafnium disulfide.

7. The integrated assembly of claim 1 wherein the two-dimensional material comprises molybdenum.

8. The integrated assembly of claim 1 wherein the two-dimensional material comprises molybdenum disulfide and/or molybdenum diselenide.

9. An integrated assembly, comprising:
a semiconductor material;
a metal-containing material over the semiconductor material; and
a diffusion barrier region between a portion of the semiconductor material and the metal-containing material, the diffusion barrier region comprising multiple layers and containing at least two distinct layers of two-dimensional material spaced from one another by an intervening region.

10. The integrated assembly of claim 9 wherein the semiconductor material is a polycrystalline material.

11. The integrated assembly of claim 9 wherein the metal-containing material is a metal silicide.

12. The integrated assembly of claim 11 wherein the metal silicide is cobalt silicide.

13. The integrated assembly of claim 9 wherein the two-dimensional material comprises one or more of carbon, boron, germanium, silicon, tin, phosphorus, bismuth, molybdenum, platinum, tungsten and hafnium.

14. The transistor of claim 9 wherein the two-dimensional material comprises molybdenum.

15. The transistor of claim 9 wherein the two-dimensional material comprises molybdenum disulfide and/or molybdenum diselenide.

* * * * *